(12) United States Patent
Choi

(10) Patent No.: US 6,965,524 B2
(45) Date of Patent: Nov. 15, 2005

(54) NON-VOLATILE STATIC RANDOM ACCESS MEMORY

(75) Inventor: Kyu Hyun Choi, Cupertino, CA (US)

(73) Assignee: O2IC, Inc., Cupertino, CA (US)

( * ) Notice: Subject to any disclaimer, the term of this patent is extended or adjusted under 35 U.S.C. 154(b) by 42 days.

(21) Appl. No.: 10/394,415

(22) Filed: Mar. 19, 2003

(65) Prior Publication Data

US 2003/0179630 A1 Sep. 25, 2003

Related U.S. Application Data

(60) Provisional application No. 60/365,976, filed on Mar. 19, 2002.

(51) Int. Cl.$^7$ .................................................. G11C 14/00
(52) U.S. Cl. ........................... 365/185.08; 365/185.14; 365/185.26; 365/185.27; 365/185.28; 365/154
(58) Field of Search ....................... 365/185.08, 185.14, 365/185.26–185.29, 154

(56) References Cited

U.S. PATENT DOCUMENTS

| | | | | |
|---|---|---|---|---|
| 4,193,128 A | * | 3/1980 | Brewer | |
| 4,271,487 A | * | 6/1981 | Craycraft et al. | |
| 4,462,090 A | * | 7/1984 | Iizuka | |
| 5,051,951 A | * | 9/1991 | Maly et al. | |
| 5,396,461 A | * | 3/1995 | Fukumoto | |
| 5,408,115 A | * | 4/1995 | Chang | |
| 5,619,470 A | * | 4/1997 | Fukumoto | |
| 5,646,885 A | * | 7/1997 | Matsuo et al. | |
| 5,946,566 A | * | 8/1999 | Choi | |
| 5,986,932 A | * | 11/1999 | Ratnakumar et al. | .. 365/185.07 |
| 6,091,634 A | * | 7/2000 | Wong | ...................... 365/185.14 |
| 6,118,157 A | * | 9/2000 | Bergemont | |
| 6,175,268 B1 | * | 1/2001 | Merrill | |
| 6,222,765 B1 | * | 4/2001 | Nojima | |
| 6,242,774 B1 | * | 6/2001 | Sung | |
| 6,266,272 B1 | * | 7/2001 | Kirihata et al. | |
| 6,285,575 B1 | * | 9/2001 | Miwa | |
| 6,363,011 B1 | * | 3/2002 | Hirose et al. | .......... 365/185.07 |
| 6,370,058 B1 | * | 4/2002 | Fukumoto | |
| 6,388,293 B1 | * | 5/2002 | Ogura | |
| 6,414,873 B1 | * | 7/2002 | Herdt | ..................... 365/185.08 |
| 6,426,894 B1 | * | 7/2002 | Hirano | |
| 6,514,819 B1 | * | 2/2003 | Choi | |
| 6,532,169 B1 | * | 3/2003 | Mann et al. | ........... 365/185.08 |
| 6,556,487 B1 | * | 4/2003 | Ratnakumar et al. | |
| 6,654,273 B2 | * | 11/2003 | Miwa et al. | |
| 2003/0223288 A1 | * | 12/2003 | Choi | |

\* cited by examiner

*Primary Examiner*—Hoai Ho
(74) *Attorney, Agent, or Firm*—Townsend and Townsend and Crew LLP

(57) ABSTRACT

In accordance with the present invention, a memory cell includes a non-volatile device and a SRAM cell. The SRAM cell includes first and second MOS transistors. The non-volatile device is a load to the SRAM cell. The memory cell may be adapted to operate differentially if a second SRAM cell and a second non-volatile device is disposed therein. If so adapted, the SRAM cells and/or the non-volatile devices when programmed store and supply complementary data. The non-volatile devices are erased prior to being programmed. Programming of the non-volatile devices may be done via hot-electron injection or Fowler-Nordheim tunneling. When a power failure occurs, the data stored in the SRAM are loaded in the non-volatile devices. After the power is restored, the data stored in the non-volatile devices are restored in the SRAM cells. The differential reading and wring of data reduces over-erase of the non-volatile devices.

17 Claims, 5 Drawing Sheets

NON-VOLATILE STATIC RANDOM ACCESS MEMORY

CROSS-REFERENCES TO RELATED APPLICATIONS

The present application claims benefit of the filing date of U.S. provisional application No. 60/365,967 filed on Mar. 19, 2002, entitled "Integrated RAM And Non-Volatile RAM Memory Cell Method And Structure Using Guiding Gate," the entire content of which is incorporated herein by reference.

The present application is related to copending application Ser. No. 10/394,417, entitled "Non-Volatile Memory Device," filed contemporaneously herewith, assigned to the same assignee, and incorporated herein by reference in its entirety.

STATEMENT AS TO RIGHTS TO INVENTIONS MADE UNDER FEDERALLY SPONSORED RESEARCH OR DEVELOPMENT

NOT APPLICABLE

REFERENCE TO AS "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to semiconductor integrated circuits. More particularly, the invention provides a semiconductor memory that has integrated non-volatile and dynamic random access memory cells. Although the invention has been applied to a single integrated circuit device in a memory application, there can be other alternatives, variations, and modifications. For example, the invention can be applied to embedded memory applications, including those with logic or micro circuits, and the like.

Semiconductor memory devices have been widely used in electronic systems to store data. There are generally two types of memories, including non-volatile and volatile memories. The volatile memory, such as a Static Random Access Memory (SRAM) or a Dynamic Random Access Memory (DRAM), loses its stored data if the power applied has been turned off. SRAMs and DRAMs often include a multitude of memory cells disposed in a two dimensional array. Due to its larger memory cell size, an SRAM is typically more expensive to manufacture than a DRAM. An SRAM typically, however, has a smaller read access time and a lower power consumption than a DRAM. Therefore, where fast access to data or low power is needed, SRAMs are often used to store the data.

Non-volatile semiconductor memory devices are also well known. A non-volatile semiconductor memory device, such as flash Erasable Programmable Read Only Memory (Flash EPROM), Electrically Erasable Programmable Read Only Memory (EEPROM) or, Metal Nitride Oxide Semiconductor (MNOS), retains its charge even after the power applied thereto is turned off. Therefore, where loss of data due to power failure or termination is unacceptable, a non-volatile memory is used to store the data.

Unfortunately, the non-volatile semiconductor memory is typically slower to operate than a volatile memory. Therefore, where fast store and retrieval of data is required, the non-volatile memory is not typically used. Furthermore, the non-volatile memory often requires a high voltage, e.g., 12 volts, to program or erase. Such high voltages may cause a number of disadvantages. The high voltage increases the power consumption and thus shortens the lifetime of the battery powering the memory. The high voltage may degrade the ability of the memory to retain its charges due to hot-electron injection. The high voltage may cause the memory cells to be over-erased during erase cycles. Cell over-erase results in faulty readout of data stored in the memory cells.

The growth in demand for battery-operated portable electronic devices, such as cellular phones or personal organizers, has brought to the fore the need to dispose both volatile as well as non-volatile memories within the same portable device. When disposed in the same electronic device, the volatile memory is typically loaded with data during a configuration cycle. The volatile memory thus provides fast access to the stored data. To prevent loss of data in the event of a power failure, data stored in the volatile memory is often also loaded into the non-volatile memory either during the configuration cycle, or while the power failure is in progress. After power is restored, data stored in the non-volatile memory is read and stored in the non-volatile memory for future access. Unfortunately, most of the portable electronic devices may still require at least two devices, including the non-volatile and volatile, to carry out backup operations. Two devices are often required since each of the devices often rely on different process technologies, which are often incompatible with each other.

To increase the battery life and reduce the cost associated with disposing both non-volatile and volatile memory devices in the same electronic device, non-volatile SRAMs and non-volatile DRAMs have been developed. Such devices have the non-volatile characteristics of non-volatile memories, i.e., retain their charge during a power-off cycle, but provide the relatively fast access times of the volatile memories.

As merely an example, FIG. 1 is a transistor schematic diagram of a prior art non-volatile SRAM 40. Non-volatile SRAM 40 includes transistors 42, 44, 46, 48, 50, 52, 54, 56, resistors 58, 60 and Flash EEPROM memory cells 62, 64. Transistors 48, 50, 52, 54 and resistors 58, 60 form a static RAM cell. Transistors 42, 44, 46, 56 are select transistors coupling EEPROM memory cells 62 and 64 to the supply voltage Vcc and the static RAM cell. Transistors 48 and 54 couple the SRAM memory cell to the true and complement bitlines BL and $\overline{BL}$.

SRAM 40 consumes relatively large power and occupies a relative large semiconductor surface area. Accordingly, a need continues to exist for a relatively small non-volatile SRAM that consumes less power than those in the prior art.

While the invention is described in conjunction with the preferred embodiments, this description is not intended in any way as a limitation to the scope of the invention. Modifications, changes, and variations, which are apparent to those skilled in the art can be made in the arrangement, operation and details of construction of the invention disclosed herein without departing from the spirit and scope of the invention.

BRIEF SUMMARY OF THE INVENTION

According to the present invention, an improved memory device and method is provided. More particularly, the invention provides a semiconductor memory that has integrated non-volatile and static random access memory cells. Although the invention has been applied to a single integrated circuit device in a memory application, there can be other alternatives, variations, and modifications. For example, the invention can be applied to embedded memory applications, including those with logic or micro circuits, and the like.

In accordance with the present invention, a memory cell includes a non-volatile device and a static random access memory (SRAM) cell. The SRAM cell includes first and second MOS transistors coupled to a bitline and to a first node of the memory cell having an associated capacitance. The non-volatile device is adapted to receive from or supply charges to the SRAM cell.

The first MOS transistor has a source terminal coupled to the first node, a drain terminal coupled to a bitline associated with the memory cell, and a gate terminal coupled to a first terminal of the memory cell. The second MOS transistor has a drain terminal coupled to the first node, a gate terminal coupled to a second node of the memory cell, and a source terminal coupled to the ground. The non-volatile device includes a substrate region coupled to a second terminal of the memory, a source region formed in the substrate region and coupled to the first node, a drain region formed in the substrate region and separated form the source region by a first channel region, a first gate overlaying a first portion of the channel region and separated therefrom via a first insulating layer, and a second gate overlaying a second portion of the channel region and separated therefrom via a second insulating layer. The first portion and second portions of the channel region do not overlap. The drain region of the non-volatile device is coupled to the third terminal of the memory cell. The first gate of the non-volatile device is coupled to the fourth terminal of the memory cell. The second gate of the non-volatile device is coupled to the fifth terminal of the memory cell.

Some embodiments of the memory cell include a second SRAM cell that operates differentially with respect to the first SRAM cell and a second non-volatile device that is similar to the first non-volatile device and operates differentially with respect to the first non-volatile device. In these embodiments, the first MOS transistor of the second SRAM cell has a source terminal coupled to the second node, a drain terminal coupled to a second complementary bitline associated with the memory cell, and a gate terminal coupled to the first terminal of the memory cell. The second MOS transistor of the second SRAM cell has a drain terminal coupled to the second node, a gate terminal coupled to the first node, and a source terminal coupled to the ground. The non-volatile device includes a substrate region coupled to the second terminal of the memory, a source region coupled to the second, a drain region coupled to the third terminal of the memory cell, a first gate coupled to a fourth terminal of the memory cell, and a second gate coupled to the fifth terminal of the memory cell.

The SRAM cell may be programmed during a write cycle. During such a cycle, one of the bitlines associated with the memory cell is raised to, e.g., Vcc volts. The other bitline is set to a voltage opposite to that of the voltage of the first bitline (i.e., 0 volts). The first terminal of the memory cell is also raised to the Vcc supply voltage. This causes one of the SRAM cells to store a 1 in its associated capacitor. The other SRAM cell stores a 0 in its associated capacitor. Data may also be transferred to the SRAM cells from the corresponding non-volatile devices after the non-volatile devices have been programmed. To load (store) the data stored in the non-volatile devices in the SRAM cells, the fifth, third and fourth terminals of the memory cell are raised to Vcc and the first terminal of the memory cell is supplied with 0 volt.

While the power is being turned off or is abruptly interrupted, the data stored in the SRAM cells is stored in the non-volatile devices. Prior to storing the data in the non-volatile devices, the non-volatile devices are erased by applying a relatively high negative voltage to the fourth terminal of the memory cell, while applying, e.g., 0 volt to the remaining terminals of the memory cell.

Programming of the non-volatile devices may be carried via either hot-electron injection or Fowler-Nordheim tunneling. When subjected to either hot-electron injection or Fowler-Nordheim tunneling, more electrons are injected and trapped in the non-volatile device coupled to the SRAM cell storing a 0 than are trapped in the non-volatile device coupled to the SRAM cell storing a 1. The threshold voltage of the non-volatile device having more trapped electrons thus increases more than the threshold voltage of the other non-volatile device. This completes the programming cycle.

To reload the data in the SRAM cells after power is restored, the Vcc supply voltage is applied to the third and fifth terminals of the memory cell. A read sensing voltage is applied to the fourth terminal of the memory cell. The read sensing voltage is smaller than the Vcc supply voltage and is so selected as to disable current flow or, in the alternative, cause relatively small current to flow in the non-volatile device having more trapped electrons. Therefore, the non-volatile device with no or fewer trapped electrons conducts a relatively larger current than the non-volatile device that has more trapped electrons. This differential current flow causes the first and second nodes to be charged or discharged to their previous states, thereby causing the SRAM cells to be reprogrammed with data they had prior to power supply termination or failure.

The accompanying drawings, which are incorporated in and form part of the specification, illustrate embodiments of the invention and, together with the description, sever to explain the principles of the invention.

DETAILED DESCRIPTION OF THE INVENTION

According to the present invention, an improved memory device and method is provided. More particularly, the invention provides a semiconductor memory that has integrated non-volatile and static random access memory cells. Although the invention has been applied to a single integrated circuit device in a memory application, there can be other alternatives, variations, and modifications. For example, the invention can be applied to embedded memory applications, including those with logic or microcircuits, and the like.

Figure 1:
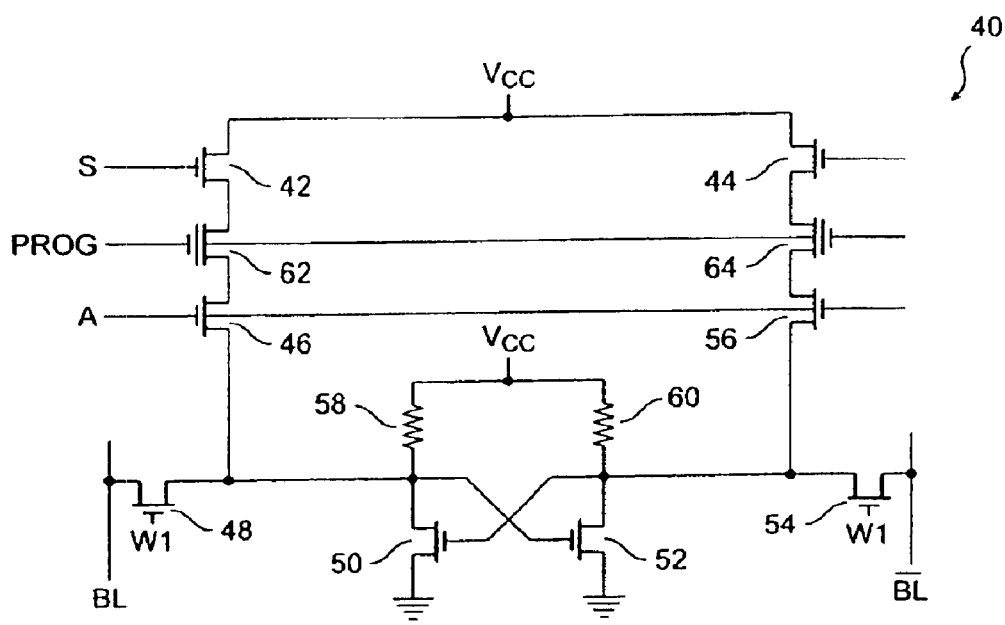
FIG. 1 is a simplified transistor schematic diagram of a non-volatile SRAM, as known in the prior art.
Figure 2:
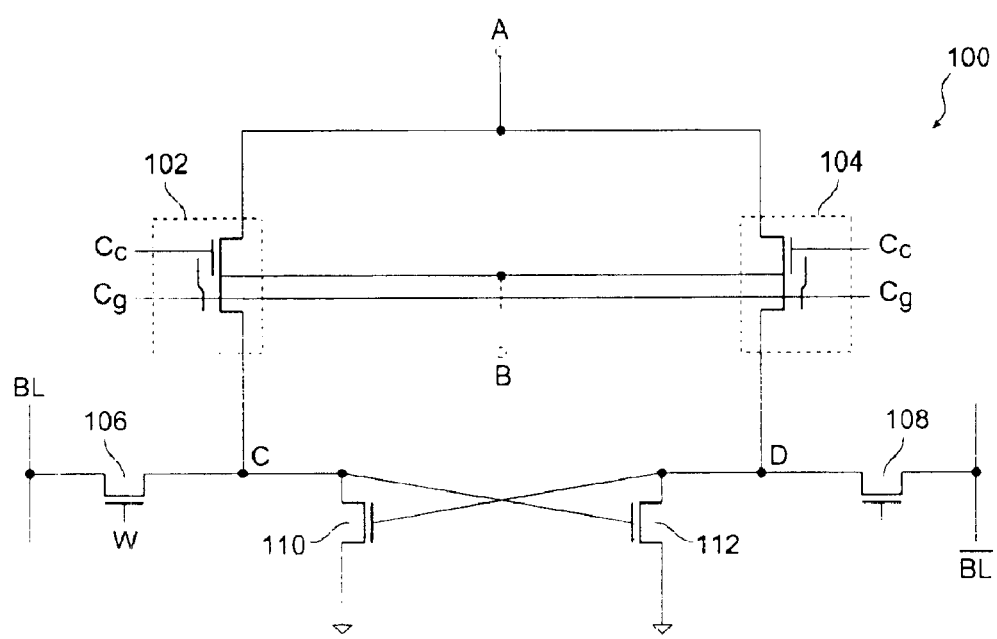
FIG. 2 is a simplified transistor schematic diagram of a differential non-volatile SRAM, in accordance with one embodiment of the present invention.
Figure 3:
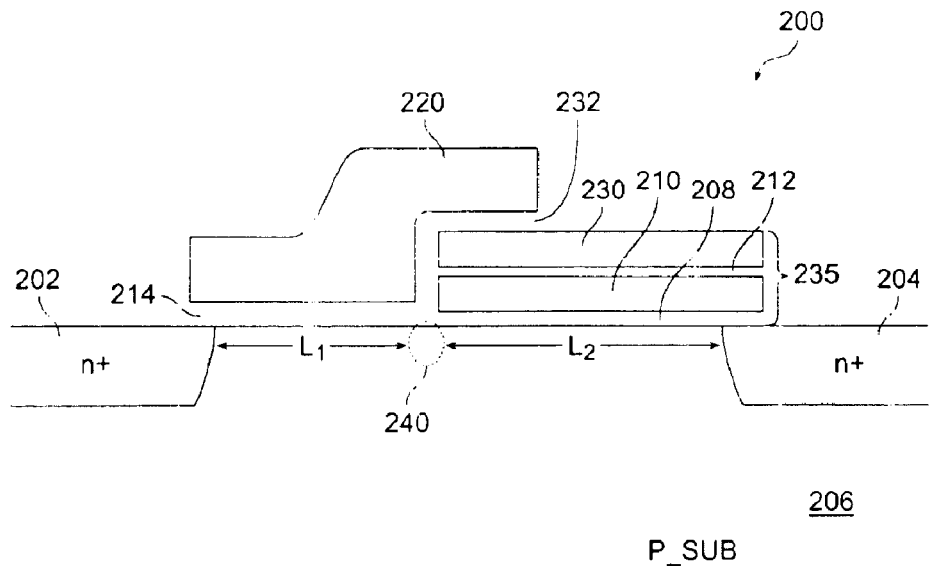
FIG. 3 is a cross-sectional view of a first embodiment of a non-volatile memory device disposed in the differential non-volatile SRAM of FIG. 2, in accordance with the present invention.
Figure 4:
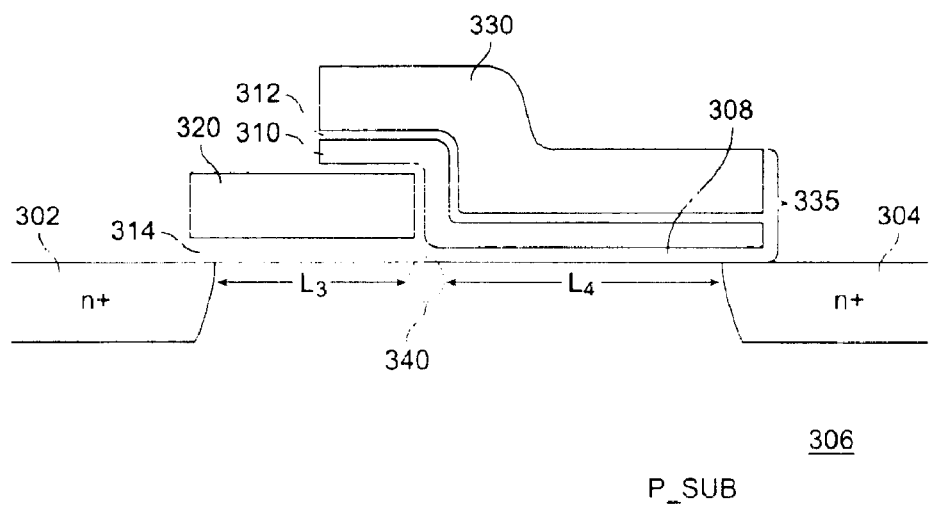
FIG. 4 is a cross-sectional view of a second embodiment of a non-volatile memory device disposed in the differential non-volatile SRAM of FIG. 2, in accordance with the present invention.

FIG. 2 is a transistor schematic diagram of a differential non-volatile static random access memory (SRAM) 100 that includes both non-volatile and latch devices, in accordance with one embodiment of the present invention. This diagram is merely an example, which should not unduly limit the scope of the claims herein. One of ordinary skill in the art would recognize many other variations, modifications, and alternatives. Differential non-volatile SRAM memory (hereinafter alternatively referred to as memory) 100 includes non-volatile memory devices 102, 104, N-channel Metal-Oxide-Semiconductor (MOS) transistors 106, 110 which together form a first latch cell, NMOS transistors 108, 112 which together form a second latch cell. The first and second latch cells are alternatively collectively referred to hereinbelow as the latch circuit.

Memory 100 includes terminals Cg, Cc, WL, BL and $\overline{BL}$. Memory 100 may be part of a memory array (not shown) disposed in a semiconductor Integrated Circuit (IC) adapted, among other functions, to store and supply the stored data. Terminals BL and $\overline{BL}$ typically form true and complementary bitlines of such a memory array and terminal WL typically forms a wordline of such a memory array. In the following terminals BL and $\overline{BL}$ are alternatively referred to as bitlines BL and $\overline{BL}$, respectively. In the following terminal WL is alternatively referred to as wordline WL.

The gate terminals of both MOS transistors 106 and 108 are coupled to wordline WL. The drain terminals of MOS transistor 106, 108 are respectively coupled to bit lines BL and $\overline{BL}$. The source terminals of MOS transistor 106, 108 are respectively coupled to nodes C and D. Node C is also coupled to the gate terminal of MOS transistor 112 and to the drain terminal of MOS transistor 110. Similarly, node D is coupled to the gate terminal of MOS transistor 110 and to the drain terminal of MOS transistor 112. The source terminals of MOS transistors 110, 112 are coupled to the $V_{ss}$ terminal. Non-volatile memory devices 102, 104 each have a guiding gate and a control gate. The guiding gate terminals of non-volatile cells 102, 104 are coupled to input terminal Cg of memory 100. The control gate terminals of non-volatile cells 102, 104 are coupled to input terminal Cc of memory 100. The drain terminals of non-volatile cells 102, 104 are coupled to input terminal A of memory 100. The source terminals of non-volatile cells 102, 104 are respectively coupled to nodes C and D. The body (i.e., the bulk) terminals of non-volatile cells 102, 104 are coupled to input terminal B of memory 100.

Non-volatile memory devices 102, 104 are described in copending application Ser. No. 10/394,417, entitled "Non-Volatile Memory Device", the content of which is incorporated herein by reference in its entirety.

Programming the Latch Circuit

To store a 1 in the latch circuit, voltage supply Vcc is applied to bitline BL and to wordline WL, while supply voltage Vss is applied to bitline $\overline{BL}$. In some embodiments of the present invention, supply voltage Vcc is between 1.2 to 5.5 volts and supply voltage Vss is at the ground potential (i.e., 0 volts). Terminals Cg, Cc and A are also held at the Vss potential. Because transistor 106 is in a conducting state, node C is raised to voltage Vcc-Vt, where Vt, is threshold voltage of any of the MOS transistors 106 and 108. Similarly, because transistor 108 is in a conducting state, node D is pulled to Vss volts (i.e., the voltage present on bitline $\overline{BL}$). Therefore, node C is charged (to Vcc-Vt) and node D is charged to 0 volts, thereby storing a 1 in the latch circuit. Refresh operations may also be carried out during refresh cycles to maintain the stored data.

To ensure that nodes C and D maintain their respective voltages of Vcc-Vt and 0 volts after a 1 is stored in the latch circuit during a programming cycle, a relatively small voltage pulse of, e.g., greater than to 2 volts is applied to the guiding gate terminal Cg and control gate terminal Cs of memory 100, a relatively small voltage pulse of, e.g., Vcc volts is applied to the terminal A of memory 100 while terminal B of memory 100 is maintained at 0 volts. The application of these pulses maintains non-volatile devices 102, 104 in conducting states. Each of these voltage pulses typically has a duration of, e.g., 5 to 50 nanoseconds. Because non-volatile devices 102, 104 are maintained in conducting states, a small differential current flows to nodes C and D to maintain the differential charges stored in these two nodes. In other embodiments, transistors 106 and 108 may be turned on periodically during refresh cycles to ensure that nodes C and D maintain their respective charges of (Vcc-Vt) and 0 volts.

To store a 0 in the latch circuit, voltage supply Vcc is applied to bitline $\overline{BL}$ and to wordline WL, while supply voltage Vss is applied to bitline BL. Terminal Cg is also held at the Vss potential. Because transistor 108 is in a conducting state, node D is raised to voltage Vcc-Vt. Similarly, because transistor 106 is in a conducting state, node C is pulled to Vss volts. Therefore, the capacitance associated with node D is charged (to Vcc–Vt) and the capacitance associated with node C is charged to 0 volts, thereby storing a 0 in the latch circuit. Refresh operations may also be carried out during refresh cycles to maintain the stored data.

To ensure that nodes D and C maintain their respective voltages of Vcc-Vt and 0 volts after a 0 is stored in the latch circuit during a programming cycle, a relatively small voltage pulse of, e.g., greater than 2 volts is applied to the guiding gate terminal Cg and control gate terminal Cs of memory 100, a relatively small voltage pulse of, e.g., Vcc volts is applied to the terminal A of memory 100 while terminal B of memory 100 is maintained at 0 volts. The application of these pulses maintains non-volatile devices 102, 104 in conducting states. Each of these voltage pulses typically has a duration of, e.g., 5 to 50 nanoseconds. Because non-volatile devices 102, 104 are maintained in conducting states, a small differential current flows to nodes C and D to maintain the differential charges stored in these two nodes. In other embodiments, transistors 106 and 108 may be turned on periodically during refresh cycles to ensure that nodes D and C maintain their respective charges of (Vcc-Vt) and 0 volts.

Figure 5:
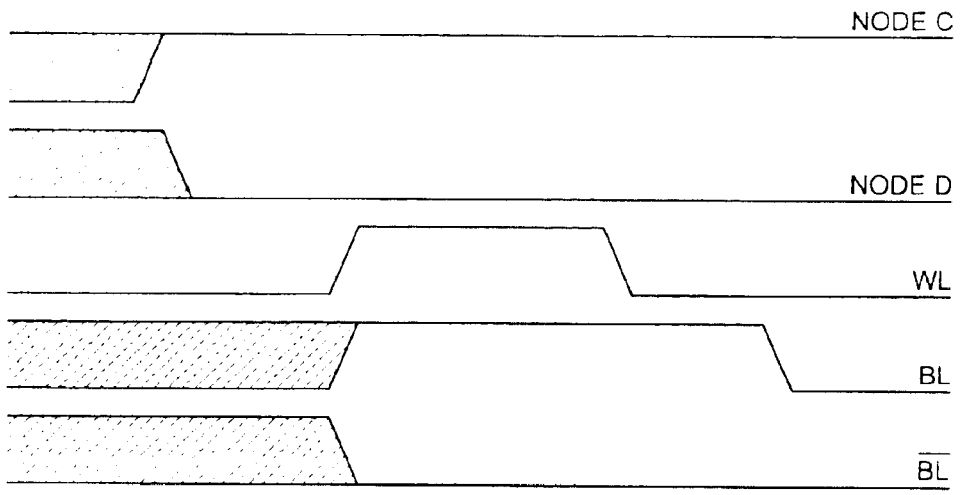
FIG. 5 is a simplified timing diagram of the volatile memory of the non-volatile SRAM of FIG. 2 during a write cycle.

FIG. 5 is a simplified timing diagram of the voltages applied to bitlines BL, $\overline{BL}$ as well as to wordline WL during a programming cycle of the SRAM cell of memory 100. In accordance with FIG. 5A, bitline BL and wordline WL are supplied with Vcc voltage while bitline $\overline{BL}$ is supplied with Vss voltage. Accordingly, node C is charged to supply voltage (Vcc-Vt) and node D is pulled to the ground voltage. The voltages at nodes C and D are maintained at these values either via the currents that flow through no-volatile devices 102, 104 or by periodically applying voltage Vcc to bitline BL and wordline WL, and applying voltage Vss to bitline $\overline{BL}$, as described above.

Reading the SRAM Cell

Figure 6:
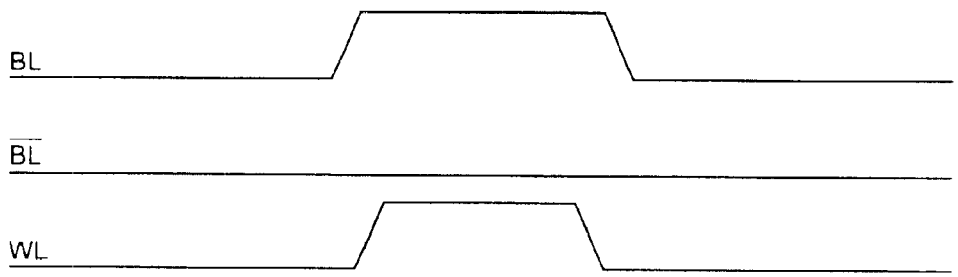
FIG. 6 is a simplified timing diagram of the volatile memory of the non-volatile SRAM of FIG. 2 during a write cycle.

To read the data stored in the SRAM cell, supply voltage Vcc is applied to input terminal WL of memory 100, thereby coupling nodes C and D of memory 100 to bitlines BL and $\overline{BL}$, respectively. The voltages present on nodes C and D cause the bitline voltages to so change thus enabling a read circuitry, such as a sense amplifier (not shown) to sense this voltage difference and generate a corresponding output signal, as is known by those skilled in the art. FIG. 6 is a simplified timing diagram of the voltage applied to input terminal WL of memory 100 during a read cycle of the SRAM cell. In accordance with FIG. 6, input terminal WL is raised to supply voltage Vcc, thereby coupling nodes C and D to bit lines BL and $\overline{BL}$, respectively. Because nodes C and D respectively have high and low stored charges, bit lines BL and $\overline{BL}$ are respectively raised to high and low voltages.

Erasing Non-volatile Devices

Non-volatile devices 102, 104 are erased before they are programmed. To erase the non-volatile devices 102, 104, terminals A, B of memory 100 are pulled to the Vss voltage. A relatively high negative voltage, e.g., −10 volts is applied to control gate terminal Cc, and guiding gate terminal Cg is either left floating or receives Vss or a small negative voltage. The application of these voltages causes electrons trapped in the nitride layer—formed between the respective control gate regions and the substrate regions of non-volatile devices 102, 104—to return to the substrate region and/or holes to be trapped in these nitride layers—due to hot hole injection—thereby neutralizing any trapped electrons. The tunneling of trapped electrons back to the substrate and/or trapping of holes in the respective nitride layers causes non-volatile devices 102, 104 to erase.

Programming Non-volatile Devices Using Hot-electron Injection

In accordance with the present invention, if the Vcc voltage supplied by, e.g. a battery, reduces below a certain value, or if there is an abrupt failure in the supply of voltage Vcc or if otherwise desired, data stored in the SRAM cell of memory cell 100 is stored in the non-volatile devices 102, 104 of memory 100. To achieve this, for example, a capacitor (not shown) is used to store charges while voltage supply is being turned off. The charges stored in the system capacitor are used by a high voltage generator circuit to generate the voltages required to operate the non-volatile memory cell. While the power supply reduction or failure occurs, data stored in the SRAM cell is loaded and stored in the non-volatile devices 102, 104 of memory 100. Non-volatile devices 102, 104 operate differentially in that if one of them, e.g., 102 is programmed to store a 1, the other one, e.g., 104 is programmed to store a 0. Therefore, during a read operation, if one of the non-volatile devices, e.g., 102 supplies a 1, the other one of the non-volatile devices, e.g., 104 supplies a 0.

In order to load the data stored in the SRAM cell in non-volatile devices 102, 104, non-volatile devices 102, 104 are first erased, as described above. Assume that the SRAM cell has stored a 1 therein, and therefore the voltages present on nodes C and D are at high and low levels respectively. To load this data in the non-volatile devices, 0 volt is applied to substrate terminal B of memory 100, a relatively high voltage Vpp in the range of, e.g., 5 to 12 volts is applied to terminal Cc of memory 100, a second voltage in the range of, e.g., 0.5 to 1.5 volts is applied to guiding gate terminal Cg, and a third voltage in the range of, e.g., 3 to 5 volts is applied to terminal A of memory 100.

Because the voltage at the guiding gate of non-volatile device 102 is less than its source voltage, non-volatile device 102 s not turned on. Accordingly, no current flows from the source to the drain of non-volatile device 102 and thus no hot electron current is generated in the channel region of non-volatile device 102. Therefore, non-volatile device 102 is kept at the erase state and its threshold voltage is maintained at its erased value. Moreover, because there is a small difference between voltages at terminals A and Cg of non-volatile device 102 and because the difference between the voltage applied to control gate terminal Cc and terminal A (i.e., the drain terminal of non-volatile device 102) is relatively small, the voltage difference across the nitride layer of non-volatile device 102 is insufficient to cause Fowler-Nordheim tunneling of electrons to occur in non-volatile device 102. Accordingly, non-volatile device 102 maintains its previous discharge state and thus its threshold voltage remains at its erased value.

To load this data in the non-volatile devices, 0 volt is applied to substrate terminal B of memory 100, a relatively high voltage Vpp in the range of, e.g., 5 to 12 volts is applied to terminal Cc of memory 100, a second voltage in the range of, e.g., 0.5 to 1.5 volts is applied to guiding gate terminal Cg, and a third voltage in the range of, e.g., 3 to 5 volts is applied to terminal A of memory 100.

Because the source region of non-volatile device 104 (i.e., node D) is at 0 volt, and a voltage in the range of, e.g., 0.5 to 1.5 volts is applied to guiding gate terminal Cg, non-volatile device 104 operates in a weak turn-on (e.g., subthreshold) state as a channel is formed under its guiding gate. Because, a third voltage in the range of, e.g., 3 to 5 volts is applied to the drain region (i.e., terminal A), a relatively small current flows between the source and drain terminals of non-volatile device 104. The weak channel formed under the guiding gate of non-volatile device 104 remains close to the ground potential. Because the voltage applied to the control gate Cc of non-volatile device 104 is greater than its drain voltage applied, the voltage in the channel region formed under the control gate of non-volatile device 104 is close to the device's drain voltage, thereby causing a relatively large lateral electric field to develop near the gap separating the channel regions formed between the guiding gate and control gate of non-volatile device 104. The relatively high electric filed causes electrons passing through the gap—as they drift from the source to the drain region—to gain the energy required to surmount the silicon-oxide barrier and thus to flow into and get trapped in the nitride layer. The electrons are trapped in the nitride layer under the control gate and are positioned relatively away from the drain region of non-volatile device 104, thereby increasing the threshold voltage of non-volatile device 104. The charges remain trapped in non-volatile device 104 after power is turned off. Therefore, non-volatile device 104 maintains its higher threshold even after power is turned off. The increase in the threshold voltage of non-volatile 104 is used to restore the programming state of the SRAM cell when the power is subsequently restored, as described further below.

Therefore, non-volatile device 104 is programmed (i.e., charged) whereas non-volatile device 102 is not programmed (i.e., is not charged). Therefore, during each such cycle, one of the non-volatile devices of memory cell 100 is programmed and the other one of the non-volatile devices of memory cell 100 remains erased. It is understood, that if the capacitance associated with node C had stored 0 volts and the capacitance associated with node D had stored (Vcc-Vt) volts, after the above programming cycle, non-volatile device 102 is programmed and non-volatile device 104 remains in an erased stated. The differential programming, whereby one of the non-volatile devices is programmed while the other one remains erased, provides advantages that are described further below.

Programming Non-volatile Devices Using Tunneling

Assume that the SRAM cell has stored a 1 therein, and therefore the voltages present on nodes C and D are at high and low levels respectively. To store this data in non-volatile devices 102, 104, 0 volt is applied to substrate terminal B of memory 100. A voltage in the range of, e.g., 1.2 volts to Vcc is applied to node A to precharge this node. After this pre-charge, the node A is left floating.

A voltage in the range of, e.g., 0.4 to 2 volts is applied to guiding gate terminal Cg of memory 100. Because the voltage at node C is in the range of, e.g., Vcc volts, no channel is formed in the substrate under the guiding gate of transistor 102. Therefore, no current flows from node A to node C via non-volatile device 102. Because node D is at, e.g., 0 volt, a channel is formed in the substrate under the guiding gate of non-volatile device 104.

A relatively high programming voltage Vpp, in the range of, e.g., 4 to 8 volts is applied to control terminal Cc of memory cell 100. Due to the capacitive coupling, the applied Vpp voltage causes a channel to be formed under the control gate of non-volatile devices 102, 104. Therefore, a current is enabled to flow from node D to node A via non-volatile device 104. As is understood by persons skilled in the art, applied voltages, such as Vpp are pulse voltages. Accordingly, the voltage that is coupled to form a channel under the control gate of non-volatile device 102 decays as a function of time. The characteristic time constant of this decay is determined by an RC time-constant, where R is the combined resistance associated with non-volatile devices 102, 104 and MOS transistor 112, and C is the capacitance associated with the nitride layer and node D. Resistance R may be varied by the voltage applied to guiding gate terminals Cg and increases when the voltage applied to guiding gate terminal Cg cause a channel to form under the guiding gates of non-volatile devices 102, 104. Nodes C and D are refreshed by turning on MOS transistors 106, 108 periodically.

When the Vpp voltage pulse is applied, a current discharges via non-volatile device 104 and MOS 112 to the ground. If the RC time constant, described above, is substantially similar to the Vpp pulse duration, a voltage gradient is formed in the channel regions of each of non-volatile device 102 and 104. Because no channel is formed under the guiding gate of non-volatile device 102, a relatively high voltage exists near the gap between the control and guiding gates of non-volatile device 102. Because a channel is formed under the guiding gate of non-volatile device 104, a relatively low voltage exists near the gap between the control and guiding gates of non-volatile device 104.

Because of the relatively large difference between the applied Vpp voltage and that which exists near the gap separating the control and guiding gates of non-volatile device 104, a relatively large number of electrons tunnel through the respective oxide layer and are trapped in the nitride layer of non-volatile device 104. Because of the relatively small difference between the applied Vpp voltage and that which exists near the gap separating the control and guiding gates of non-volatile device 102, a relatively small number of electrons tunnel through the respective oxide layer and are trapped in the nitride layer of non-volatile device 102. In other words, more electrons are trapped in the nitride layer of non-volatile device 104 than are trapped in the nitride layer of non-volatile device 102.

The difference in the number of trapped electrons, cause non-volatile devices 102 and 104 to have different threshold voltages. Because a relatively higher number of electrons are trapped in the nitride layer of non-volatile device 104 than they are in the nitride layer of non-volatile device 102, non-volatile device 104 has a higher threshold voltage than does non-volatile device 102. Consequently, non-volatile device 104 is programmed to have a higher threshold voltage than is non-volatile device 102, whose threshold voltage remains substantially the same as it is prior to the programming cycle. As is seen from the above, during each such programming cycle, one of the non-volatile devices is programmed to have a higher threshold than the other. The differential programming provides advantages that are described further below. The charges remain trapped in non-volatile device 104 after power is turned off. Therefore, non-volatile device 104 maintains its higher threshold even after power is turned off. The relatively higher threshold voltage of non-volatile device 104 compared to that of non-volatile device 102 is used to restore the programming state of the SRAM cells when the power is subsequently restored.

The trapped electrons are spatially positioned in the nitride layer above the channel region. The largest concentration of electrons trapped in non-volatile device 104 are spaced near the guiding gate edge and at a distant that is relatively away from the drain region of non-volatile device 104. In contrast, for non-volatile device 102, the smallest concentration of trapped electrons are spaced near the guiding gate edge and at a distant that is relatively away from its drain region. As is known by those skilled in the art, the trappings of he electrons near the source region raises the threshold voltage of the device.

Reprogramming of the SRAM Cell

After power is restored, the SRAM cell is reloaded (i.e., reprogrammed) with data that it had prior to the power-off. As described above, this data is stored in the non-volatile devices differentially during the power-off. To reload this data in the SRAM cell, the Vcc voltage is applied to the terminals A and Cg of memory 100. Terminal B of memory 100 is pulled to the ground potential. A relatively small sensing voltage (i.e., less than the Vcc voltage) is applied to terminal Cc. The sensing voltage is selected so as to be larger than the threshold voltage of the erased non-volatile device and smaller than the threshold of the programmed non-volatile device.

Because the gate-to-source voltage of non-volatile device 102 is greater than its threshold voltage and because of the presence of a voltage across the drain and source terminals of non-volatile device 102, a current flows between drain and source terminals of non-volatile device 102. Depending on the magnitude of the increase in the threshold voltage of non-volatile device 104, either non-volatile device 104 conducts no current or, alternatively conducts a current with a magnitude that is smaller than that conducted by non-volatile device 102.

The difference between the magnitude of the currents flowing through non-volatile device 102 and that, if any, flowing through non-volatile device 104, results in differential charging of nodes C and D. Because node C is charged at a higher rate than node D, MOS transistor 112 is turned on, thereby pulling node D to the ground potential. MOS transistor 110 is turned off, thereby enabling node C to be pulled high to the Vcc voltage. Because nodes C and D are charged to the Vcc and the ground potential, respectively, data is restored in the SRAM cell.

As described above, during the power restore operation and when data stored in non-volatile devices 102 and 104 are read out, the current flow through non-volatile devices 102 and 104 is differential. Therefore, any change in the threshold voltages of non-volatile devices 102 and 104 due to over-erase also occurs differentially. The differential current flow through non-volatile devices 102 and 104, in accordance with the present invention, minimizes any data retention or read errors that may occur as a result of over erasing non-volatile devices 102 and 104 during erase cycles.

Recall of the SRAM Cell

To initiate a recall, both BL and $\overline{BL}$ lines are pulled down to the ground potential. Input terminal WL is raised to the Vcc voltage, thus enabling both nodes C and D to discharge to the ground potential. Input terminals Cg is raised to the Vcc voltage to enable, in part, a conduction path to form between the SRAM cell and the non-volatile devices. Terminal A is also raised to supply voltage Vcc, and a sensing voltage in the range of, e.g. 2 to 3 volts, is applied to terminal Cc. Because, as described above, non-volatile device 104 is assumed to have a higher threshold voltage than non-volatile device 102, more current flows through non-volatile device 102 than through non-volatile device 104. Therefore, node C is charged to a higher potential than node D. The higher potential at node C causes MOS transistor 112 to turn on to discharge node D to ground even after the voltage applied to terminal WL is lowered so as to turn off transistors 106, 108. Therefore, the voltage at node C is restored to its prior value of 1 while the voltage at node D is restored to its prior value of 0.

Figure 7:
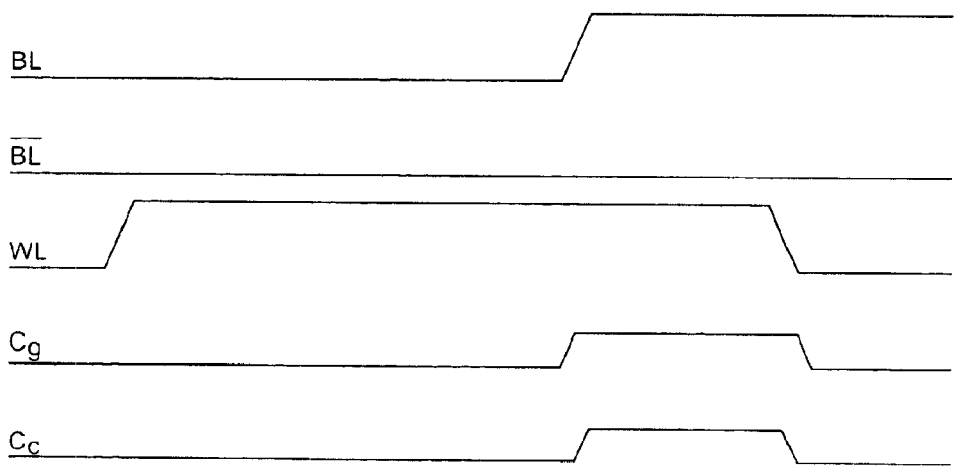
FIG. 7 is a simplified timing diagram of the volatile memory of the non-volatile SRAM of FIG. 2 during a recall cycle.

FIG. 7 shows the voltages applied to various terminals of memory 100 during a recall procedure. As is seen from FIG. 7, input terminals Cg and WL are raised to the supply voltage Vcc, thus enabling bitlines BL and $\overline{BL}$ to receive the voltages a nodes C and D respectively. Application of a relatively low read voltage (sensing voltage) to terminal Cc causes nodes C and D to respectively restore their relatively high and low voltages.

Figure 8:
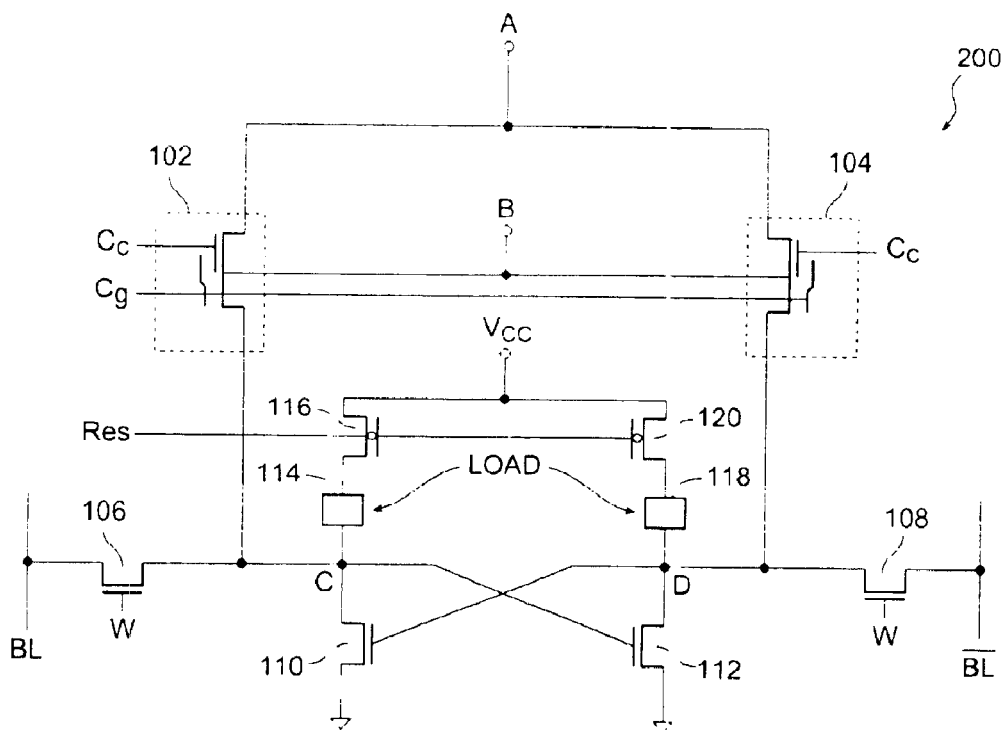
FIG. 8 is a simplified transistor schematic diagram of a differential non-volatile SRAM, in accordance with a second embodiment of the present invention.

FIG. 8 shows a schematic diagram of a non-volatile SRAM 200, in accordance with another embodiment of the present invention. Non-volatile SRAM 200 is similar to non-volatile SRAM 100 except that includes resistive loads 114, 118 and transistors 116, 120. Resistive load 114 has a first terminal coupled to node C and a second terminal coupled to the drain (source) terminal of MOS transistor 116. The source (drain) terminal of MOS transistor 116 is supplied to the supply voltage Vcc. Resistive load 118 has a first terminal coupled to node D and a second terminal coupled to the drain (source) terminal of MOS transistor 120. The source (drain) terminal of MOS transistor 120 is supplied to the supply voltage Vcc. Signal RES is applied to the gate terminals of MOS transistors 116, 120. In the embodiment 200, MOS transistors 116 and 120 are shown as being PMOS transistors. It is understood, however, that MOS transistors 116, 120 may be NMOS transistors. In the description below, it is assumed that transistors 116, 120 are PMOS transistors.

During a recall operation when data from the non-volatile devices is stored in the SRAM cells, signal RES is raised to a high voltage, thereby turning off PMOS transistors 116, 120. During a normal read operation, signal RES is lowered to, e.g., the ground potential, thereby turning on PMOS transistors 116, 120. Because transistors 116, 120 are turned on, a differential current flows through resistive loads 114, 116 to restore the charges of nodes C and D.

Figure 9:
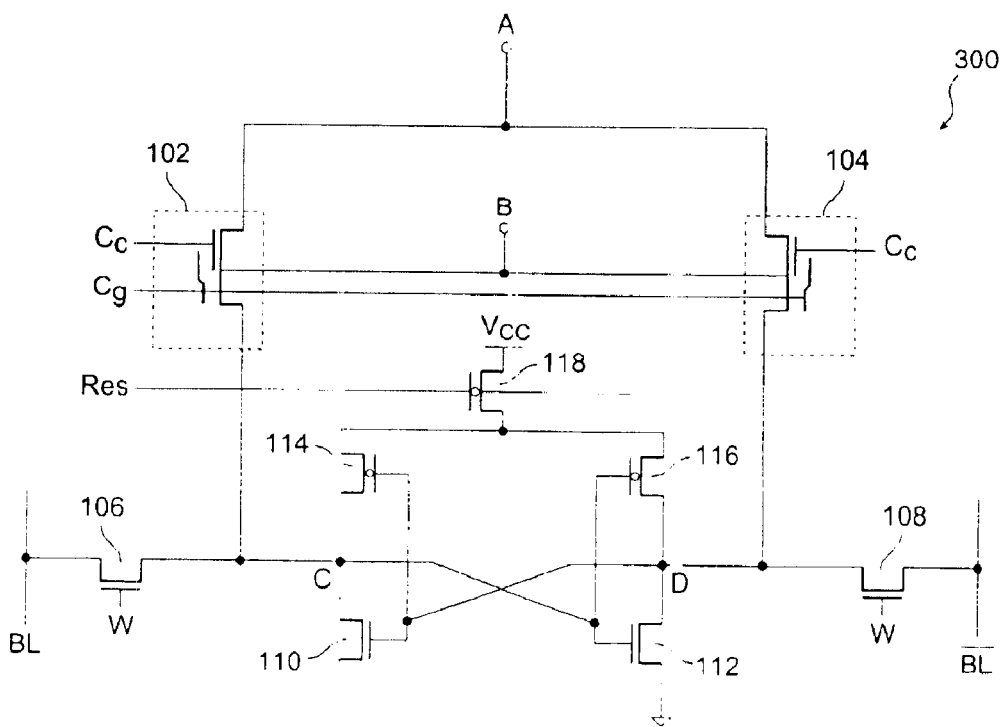
FIG. 9 is a simplified transistor schematic diagram of a differential non-volatile SRAM, in accordance with a third embodiment of the present invention.

FIG. 9 shows a schematic diagram of a non-volatile SRAM 300, in accordance with another embodiment of the present invention. Non-volatile SRAM 300 is similar to non-volatile SRAM 100 except that includes PMOS transistors 114, 116, 118. PMOS transistor 114 has a source terminal coupled to the drain terminal of PMOS transistor 118, a drain terminal coupled to the drain terminal of NMOS transistor 110, and a gate terminal coupled to the gate terminal of NMOS transistor 110. PMOS transistor 116 has a source terminal coupled to the drain terminal of PMOS transistor 118, a drain terminal coupled to the drain terminal of NMOS transistor 112, and a gate terminal coupled to the gate terminal of NMOS transistor 112. The source terminal of PMOS transistor 118 is supplied to the supply voltage Vcc. Signal RES is applied to the gate terminals of PMOS transistor 118. In the embodiment 300, MOS transistors 114, 116 and 118 are shown as being PMOS transistors. It is understood, however, that MOS transistors 114, 116 and 118 may be NMOS transistors. In the description below, it is assumed that transistors 14, 116 and 118 are PMOS transistors.

During a recall operation when data from the non-volatile devices is stored in the SRAM cells, signal RES is raised to a high voltage, thereby turning off PMOS transistor 118. During a normal read operation, signal RES is lowered to, e.g., the ground potential, thereby turning on PMOS transistors 114, 116, 118. Because transistors 114, 116, 118 are turned on, a differential current flows through resistive loads 114, 116 to restore the charges of nodes C and D.

The above embodiments of the present invention are illustrative and not limitative. The invention is not limited by the type of non-volatile memory transistor disposed in the memory cell of the present invention. Moreover, both N-channel and P-channel transistors may be used to form the SRAM as well as the non-volatile memory cells of the present invention. The invention is not limited by the type of integrated circuit in which the memory cell of the present invention is disposed. For example, the memory cell, in accordance with the present invention, may be disposed in a programmable logic device, a central processing unit, and a memory having arrays of memory cells or any other IC which is adapted to store data.

While the invention is described in conjunction with the preferred embodiments, this description is not intended in any way as a limitation to the scope of the invention. Modifications, changes, and variations, which are apparent to those skilled in the art, can be made in the arrangement, operation and details of construction of the invention disclosed herein without departing from the spirit and scope of the invention.

What is claimed is:

1. A memory cell comprising:
  a first MOS transistor having a first current carrying terminal coupled to a first node, a second current carrying terminal coupled to a first bitline associated with the memory cell, and a gate terminal coupled to a first terminal of the memory cell;
  a second MOS transistor having a first current carrying terminal coupled to the first node, a gate terminal coupled to a second node, and a second current carrying terminal adapted to receive a first voltage;
  a first non-volatile device comprising:
    a first substrate region coupled to a second terminal of the memory;
    a source region formed in the first substrate region and coupled to the first node;

a drain region formed in the first substrate region and separated from the source region by a first channel region; said drain region being coupled to a third terminal of the memory cell;

a first gate overlaying a first portion of the first channel region and separated therefrom via a first insulating layer; said first gate coupled to a fourth terminal of the memory cell; and a second gate overlaying a second portion of the first channel region and separated therefrom via a second insulating layer; wherein said first portion of the first channel region and said second portion of the channel do not overlap and wherein said second gate is coupled to a fifth terminal of the memory cell, said first non-volatile device being adapted so as not to include a floating gate disposed between said first and second gates thereof;

a third MOS transistor having a first current carrying terminal coupled to the second node, a second current carrying terminal coupled to a second bitline associated with the memory cell, and a gate terminal coupled to the first terminal of the memory cell;

a fourth MOS transistor having a first current carrying terminal coupled to the second node, a gate terminal coupled to the first node, and a second current carrying terminal adapted to receive the first voltage, and second non-volatile device comprising:

a second substrate region coupled to the second terminal of the memory;

a source region formed in the second substrate region and coupled to the second node;

a drain region formed in the second substrate region and separated from the source region of the second substrate region by a second channel region; said drain region of the second substrate region being coupled to the third terminal of the memory cell;

a first gate overlaying a first portion of the second channel region and separated therefrom via a first insulating layer and coupled to the fourth terminal of the memory cell; and a second gate overlaying a second portion of the second channel region and separated therefrom via a second insulating layer; wherein said first portion of the second channel region and said second portion of the second channel region do not overlap and wherein said second gate overlaying the second portion of the second channel region is coupled to the fifth terminal of the memory cell said second non-volatile device being adapted so as not to include a floating gate disposed between said first and second gates thereof.

2. The memory cell of claim 1 wherein the first and second nodes receive their respective voltages from the first and second bitlines and maintain their respective voltages after the first and third MOS transistors are turned off.

3. The memory cell of claim 2 wherein the first and second non-volatile devices are adapted to store charges representative of the voltages of the first and second nodes during a power-off cycle.

4. The memory cell of claim 3 wherein during the power-off cycle, the second terminal of the memory cell is adapted to receive the first voltage, the third terminal of the memory cell is adapted to receive a second voltage, the fourth terminal of the memory cell is adapted to receive a third supply voltage, and the fifth terminal of the memory cell is adapted to receive a fourth supply voltage.

5. The memory cell of claim 4 wherein the fourth voltage is greater than the first, second and third voltages.

6. The memory cell of claim 5 wherein the first voltage is 0 volt.

7. The memory cell of claim 5 wherein during the power-off cycle one of the first and second non-volatile devices traps more electrons in its nitride layer than does the other one of the first and second non-volatile devices.

8. The memory cell of claim 7 wherein the electrons are trapped via hot-electron injection.

9. The memory cell of claim 7 wherein the electrons are trapped via tunneling.

10. The memory cell of claim 7 wherein after the power-off cycle, the first and second nodes store charges they had prior to the power-off cycle.

11. The memory cell of claim 10 wherein after the power-off cycle, the first voltage is applied to the first and second terminals, the second voltage is applied to the third and fifth input terminals, and a fifth voltage is applied to the fourth terminal, wherein the fifth voltage is smaller than the second voltage.

12. The memory cell of claim 11 wherein the trapped electrons are untrapped by applying the first voltage to first, second and third terminals of the memory cell, applying a negative voltage to the fifth terminal of the memory cell and by enabling the fourth terminal of the memory cell to float.

13. The memory cell of claim 12 wherein at least one of said first and second non-volatile devices operates in a subthreshold region.

14. The memory cell of claim 1 wherein said first and second MOS transistors are periodically turned on.

15. The memory cell of claim 1 wherein said memory cell further includes at least one resistive load.

16. The memory cell of claim 1 wherein said second and fourth MOS transistors are NMOS transistors and wherein said memory cell further includes first and second PMOS transistors coupled to the said second and fourth NMOS transistors.

17. The memory cell of claim 1 wherein said first insulating layer comprises oxide and nitride layers.

* * * * *